US010965099B2

(12) United States Patent
Kitano

(10) Patent No.: US 10,965,099 B2
(45) Date of Patent: Mar. 30, 2021

(54) LIGHT CONTROL DEVICE, CONTROL METHOD, PROGRAM AND STORAGE MEDIUM

(71) Applicant: PIONEER CORPORATION, Tokyo (JP)

(72) Inventor: Kazutoshi Kitano, Kanagawa (JP)

(73) Assignee: PIONEER CORPORATION, Tokyo (JP)

(*) Notice: Subject to any disclaimer, the term of this patent is extended or adjusted under 35 U.S.C. 154(b) by 367 days.

(21) Appl. No.: 15/759,823

(22) PCT Filed: Oct. 6, 2015

(86) PCT No.: PCT/JP2015/078279
§ 371 (c)(1),
(2) Date: Mar. 13, 2018

(87) PCT Pub. No.: WO2017/060965
PCT Pub. Date: Apr. 13, 2017

(65) Prior Publication Data
US 2018/0254607 A1 Sep. 6, 2018

(51) Int. Cl.
*H01S 5/042* (2006.01)
*G01S 7/484* (2006.01)
(Continued)

(52) U.S. Cl.
CPC ............ *H01S 5/0428* (2013.01); *G01S 7/484* (2013.01); *G01S 7/489* (2013.01); *G01S 17/42* (2013.01); *G01S 17/93* (2013.01); *G01S 17/931* (2020.01)

(58) Field of Classification Search
None
See application file for complete search history.

(56) References Cited

U.S. PATENT DOCUMENTS 8,473,144 B1 6/2013 Dolgov et al.
9,121,703 B1* 9/2015 Droz ..................... G01S 17/42
(Continued)

FOREIGN PATENT DOCUMENTS

JP 2005077379 A 3/2005
JP 2005156261 A 6/2005
(Continued)

OTHER PUBLICATIONS

Extended European Search Report for related EP App No. 15905785.0 dated Mar. 28, 2019, 9 pgs.
(Continued)

*Primary Examiner* — Luke D Ratcliffe
*Assistant Examiner* — Amir J Askarian
(74) *Attorney, Agent, or Firm* — Procopio, Cory, Hargreaves & Savitch LLP

(57) ABSTRACT

A LIDAR unit includes: an LD driver, a laser diode, and a scanner corresponding to an emission unit; a photo detector, a current/voltage conversion circuit, a A/D converter and an valuable segmenter that correspond to a light receiving unit; a landmark position prediction unit and landmark map acquisition unit that acquire position information indicating the position of a landmark on a map; and a synchronization controller that generates a valuable pulse trigger signal and a segment extraction signal. Based on a predicted current vehicle position value and the position of the landmark on the map, the landmark position prediction unit determines a predicted angular range of the landmark. The synchronization controller generates the valuable pulse trigger signal and the segment extraction signal such that the scan density of the light pulse is higher in the predicted angular range than the scan density of the light pulse in the other range.

4 Claims, 8 Drawing Sheets

(51) Int. Cl.
*G01S 7/489* (2006.01)
*G01S 17/93* (2020.01)
*G01S 17/42* (2006.01)
*G01S 17/931* (2020.01)

(56) References Cited

U.S. PATENT DOCUMENTS

| | | | |
|---|---|---|---|
| 9,235,988 B2 * | 1/2016 | Mimeault | G08G 1/015 |
| 2005/0046823 A1 | 3/2005 | Ando et al. | |
| 2006/0244978 A1 * | 11/2006 | Yamada | G01S 17/931 |
| | | | 356/614 |
| 2013/0325243 A1 | 12/2013 | Lipkowski et al. | |
| 2014/0078519 A1 * | 3/2014 | Steffey | G01S 7/4817 |
| | | | 356/625 |
| 2014/0121880 A1 | 5/2014 | Dolgov et al. | |
| 2014/0297094 A1 | 10/2014 | Dolgov et al. | |
| 2015/0077143 A1 * | 3/2015 | Maekawa | G01N 21/47 |
| | | | 324/693 |
| 2016/0169659 A1 | 6/2016 | Steffey et al. | |
| 2019/0285732 A1 * | 9/2019 | Retterath | G01S 17/93 |

FOREIGN PATENT DOCUMENTS

| | | | |
|---|---|---|---|
| JP | 2006-329971 A | | 12/2006 |
| JP | 2009217680 A | | 9/2009 |
| JP | 2011-17666 A | | 1/2011 |
| JP | 2014-89691 A | | 5/2014 |
| JP | 2017032355 A | * | 2/2017 |
| WO | 2014043461 A1 | | 3/2014 |

OTHER PUBLICATIONS

International Search Report for related PCT Application No. PCT/JP2015/078279 dated Dec. 28, 2015; 8 pages.

"Map-Based Precision Vehicle Localization in Urban Environments" Robotics: Science and Systems III, 2008; published Jun. 2007 8 Pages. Cited in the JP App. No. 2019-212405 OA dated Dec. 1, 2020.

* cited by examiner

_US 10,965,099 B2_

LIGHT CONTROL DEVICE, CONTROL METHOD, PROGRAM AND STORAGE MEDIUM

CROSS-REFERENCE TO RELATED APPLICATIONS

This application is a U.S. National Stage entry of PCT Application No: PCT/JP2015/078279 filed Oct. 6, 2015, the contents of which are incorporated herein by reference.

TECHNICAL FIELD

The present invention relates to a technology of a transmission control of a light pulse for measurement.

BACKGROUND TECHNIQUE

Conventionally, there is known a technology for measuring the distance to a peripheral object. For example, Patent Reference-1 discloses a vehicle-mounted system equipped with a LIDAR which detects a point group of the surface of an object by scanning the horizontal direction with intermittently emitted laser light and by receiving the reflected laser light.

Patent Reference-1: Japanese Patent Application Laid-open under No. 2014-89691

DISCLOSURE OF INVENTION

Problem to be Solved by the Invention

In the case of capturing a landmark situated in a peripheral environment by a LIDAR, when the landmark on the scanning plane is relatively small compared to the scanning angular resolution, e.g., when the landmark is situated away, the number of the measurement points corresponding to the landmark is too small to correctly recognize the shape of the landmark and the like.

The above is an example of the problem to be solved by the present invention. An object of the present invention is to provide a light control device capable of precisely measuring a landmark situated within a measurement range.

Means for Solving the Problem

One invention is a light control device including: a transmission/receiving unit configured to include an emitting unit and a light receiving unit, the emitting unit emitting light while changing an outgoing direction of the light, the receiving unit receiving the light; a first acquisition unit configured to acquire first information indicating at least a position of a predetermined object; and a control unit configured to perform a control of the emitting unit, wherein the control unit differentiates the control in a first direction in which the predetermined object exists from the control in the other direction, the first direction being estimated on a basis of current position information of a moving body and the first information.

Another invention is a light control device, including: a transmission/receiving unit configured to include an emitting unit that emits light and a light receiving unit that receives the light; a first acquisition unit configured to acquire first information indicating at least a position of a predetermined object; and a determination unit configured to determine, on a basis of the first information and current position information of a moving body, a range in which the emitting unit emits the light.

Still another invention is a control method executed by a light control device which controls a transmission/receiving unit, the transmission/receiving unit including an emitting unit and a light receiving unit, the emitting unit emitting light while changing an outgoing direction of the light, the receiving unit receiving the light, the control method including: a first acquisition process to acquire first information indicating at least a position of a predetermined object; and a control process to perform a control of the emitting unit, wherein the control process differentiates the control in a first direction in which the predetermined object exists from the control in the other direction, the first direction being estimated on a basis of current position information of a moving body and the first information.

Still another invention is a program executed by a computer which controls a transmission/receiving unit, the transmission/receiving unit including an emitting unit and a light receiving unit, the emitting unit emitting light while changing an outgoing direction of the light, the receiving unit receiving the light, the program making the computer function as: a first acquisition unit configured to acquire first information indicating at least a position of a predetermined object; and a control unit configured to perform a control of the emitting unit, wherein the control unit differentiates the control in a first direction in which the predetermined object exists from the control in the other direction, the first direction being estimated on a basis of current position information of a moving body and the first information.

Still another invention is a light control device including: a transmission/receiving unit configured to include an emitting unit and a light receiving unit, the emitting unit emitting light while changing an outgoing direction of the light, the receiving unit receiving the light; a first acquisition unit configured to acquire first information indicating at least a position of a predetermined object; and a control unit configured to control the emitting unit to switch, on a basis of current position information of a moving body and the first information, between a first emitting mode to emit the light at a first frequency and a second emitting mode to emit the light at a frequency lower than the first frequency.

DETAILED DESCRIPTION OF THE PREFERRED EMBODIMENTS

Figure 1:
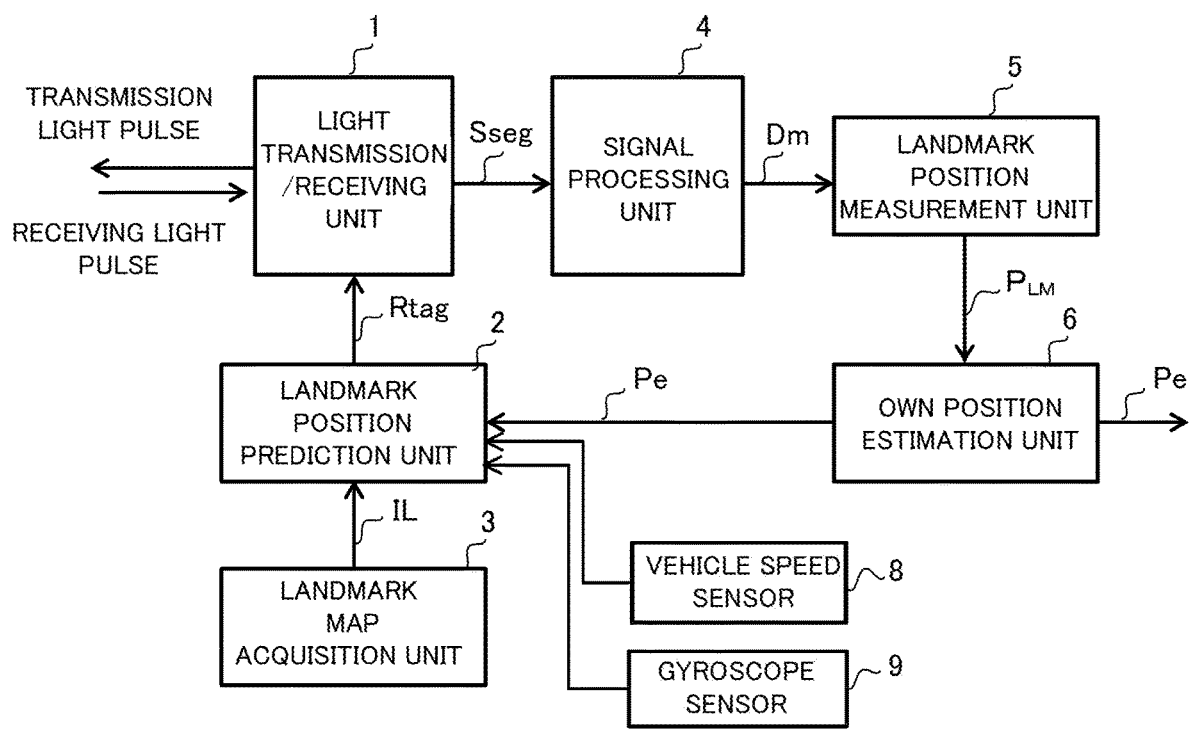
FIG. 1 illustrates a schematic configuration of a LIDAR unit.

According to a preferable embodiment of the present invention, there is provided a light control device including: a transmission/receiving unit configured to include an emitting unit and a light receiving unit, the emitting unit emitting light while changing an outgoing direction of the light, the receiving unit receiving the light; a first acquisition unit configured to acquire first information indicating at least a position of a predetermined object; and a control unit configured to perform a control of the emitting unit, wherein the control unit differentiates the control in a first direction in which the predetermined object exists from the control in the other direction, the first direction being estimated on a basis of current position information of a moving body and the first information.

The above light control device includes a transmission/receiving unit configured to include an emitting unit and a light receiving unit, a first acquisition unit and a control unit. The first acquisition unit acquires first information indicating at least a position of a predetermined object. The control unit performs a control of the emitting unit so that the control unit differentiates the control in a first direction in which the predetermined object exists from the control in the other direction, wherein the first direction is estimated on a basis of current position information of a moving body and the first information. According to this mode, the light control device can perform a control of emitting the light to differentiate the control in a direction in which a predetermined object is estimated to exist from the control in the other direction.

In one mode of the light control device, the control unit performs the control of the emitting unit so that a frequency of emitting the light in the first direction is higher than a frequency of emitting the light in the other direction. In this way, the light control device can densely and efficiently irradiate the predetermined object with the light.

In another mode of the light control device, the control unit performs the control of the emitting unit so that an intensity of the light in the first direction is lower than an intensity of the light in the other direction. According to this mode, even when raising the frequency of the light emission, the light control device can achieve the eye safe by suppressing the increase of the averaged power of the emitting light.

In still another mode of the light control device, the light control device further includes a second acquisition unit configured to acquire second information on a light reflectance of the predetermined object, wherein the control unit performs the control, at a time when the light reflectance is equal to or higher than a predetermined rate, so that the intensity of the light in the first direction is lower than the intensity of the light in the other direction. According to this mode, the light control device weakens the intensity of the light emission only when weakening the intensity of the light emission does not cause any troubles. Thereby, it is possible to precisely receive the light reflected by the predetermined object.

In still another mode of the light control device, the control unit performs the control so that a scanning speed in the first direction by the emitting unit is slower than a scanning speed in the other direction by the emitting unit. Even in this case, the light control device can densely irradiate the predetermined object with the light.

According to another preferable embodiment of the present invention, there is provided a light control device, including: a transmission/receiving unit configured to include an emitting unit that emits light and a light receiving unit that receives the light; a first acquisition unit configured to acquire first information indicating at least a position of a predetermined object; and a determination unit configured to determine, on a basis of the first information and current position information of a moving body, a range in which the emitting unit emits the light. According to this mode, the light control device can precisely set the range of the light emission to such a range that a predetermined object is predicted to exist.

According to another preferable embodiment of the present invention, there is provided a control method executed by a light control device which controls a transmission/receiving unit, the transmission/receiving unit including an emitting unit and a light receiving unit, the emitting unit emitting light while changing an outgoing direction of the light, the receiving unit receiving the light, the control method including: a first acquisition process to acquire first information indicating at least a position of a predetermined object; and a control process to perform a control of the emitting unit, wherein the control process differentiates the control in a first direction in which the predetermined object exists from the control in the other direction, the first direction being estimated on a basis of current position information of a moving body and the first information. By executing the above control method, the light control device can perform a control of emitting the light to differentiate the control in a direction in which a predetermined object is estimated to exist from the control in the other direction.

According to another preferable embodiment of the present invention, there is provided a program executed by a computer which controls a transmission/receiving unit, the transmission/receiving unit including an emitting unit and a light receiving unit, the emitting unit emitting light while changing an outgoing direction of the light, the receiving unit receiving the light, the program making the computer function as: a first acquisition unit configured to acquire first information indicating at least a position of a predetermined object; and a control unit configured to perform a control of the emitting unit, wherein the control unit differentiates the control in a first direction in which the predetermined object exists from the control in the other direction, the first direction being estimated on a basis of current position information of a moving body and the first information. By executing the above program, the computer can perform a control of emitting the light to differentiate the control in a direction in which a predetermined object is estimated to exist from the control in the other direction. Preferably, the program can be treated in a state that it is stored in a storage medium.

According to another preferable embodiment of the present invention, there is provided a light control device including: a transmission/receiving unit configured to include an emitting unit and a light receiving unit, the emitting unit emitting light while changing an outgoing direction of the light, the receiving unit receiving the light; a first acquisition unit configured to acquire first information indicating at least a position of a predetermined object; and a control unit configured to control the emitting unit to switch, on a basis of current position information of a moving body and the first information, between a first emitting mode to emit the light at a first frequency and a second emitting mode to emit the light at a frequency lower than the first frequency. According to this mode, the light control device can switch the frequency of the light emission depending on the position of the predetermined object and therefore can densely and efficiently irradiate the predetermined object with the light.

Embodiment

Now, a preferred embodiment of the present invention will be described below with reference to the attached drawings.

[Entire Configuration]

FIG. 1 illustrates a block configuration of a LIDAR unit 100 according to the embodiment. The LIDAR unit 100 illustrated in FIG. 1 is a LIDAR (Light Detection and Ranging, or Laser Illuminated Detection and Ranging) based on TOF (Time of Flight), and performs a 360-degree ranging of objects in a horizontal direction to precisely estimate the current position needed to perform autonomous driving. The LIDAR unit 100 mainly includes a light transmission/receiving unit 1, a landmark position prediction unit 2, a landmark map acquisition unit 3, a signal processing unit 4, a landmark position measurement unit 5, an own position estimation unit 6, a vehicle speed sensor 8 and a gyroscope sensor 9. Hereinafter, the current time that is a criterion time of processing is referred to as "time t" and the execution time one processing frame before the time t is referred to as "time t−1".

The light transmission/receiving unit 1 emits pulse lasers at all directions equivalent to 360 degrees in the horizontal direction while gradually changing the outgoing direction of the pulse lasers. In this case, the light transmission/receiving unit 1 emits a pulse laser per segment (900 to 4500 segments in total according to the embodiment) into which 360 degrees in the horizontal direction are evenly divided. In this case, as mentioned later, regarding a predetermined emitting range specified by the landmark position prediction unit 2, the light transmission/receiving unit 1 narrows (reduces) the angle between segments while increasing the frequency (rate) of the light pulse emission compared to the other range. Then, the light transmission/receiving unit 1 supplies the signal processing unit 4 with a signal (referred to as "segment signal Sseg") which indicates the received light intensity per segment measured by receiving a reflective light of the pulse laser during a predetermined period after emitting the pulse laser.

The landmark position prediction unit 2 predicts the position (referred to as "own position") of the LIDAR unit 100 at the time t and further predicts, on the basis of the predicted own position at the time t, the direction in which a predetermined object (referred to as "landmark") is to be detected, wherein the landmark is used as a reference mark to estimate the own position. It is noted that the own position at the time t predicted by the landmark position prediction unit 2 is an interim position whose accuracy is lower than the own position estimated by the own position estimation unit 6 mentioned later. For example, the landmark is a predetermined feature periodically arranged along a road such as a kilometer post, a hundred meter post, a delineator, a traffic infrastructure (e.g., a signage, a direction signboard and a traffic signal), a utility pole, a street lamp. The landmark is an example of the "predetermined object" according to the present invention.

In this case, the landmark position prediction unit 2 firstly calculates a predicted value of the own position at the time t by a publicly known calculation method based on an estimated value at the time t−1 estimated by the own position estimation unit 6 mentioned later, the moving speed outputted by the vehicle speed sensor 8 and the angular rate outputted by the gyroscope sensor 9. In this case, for example, the landmark position prediction unit 2 calculates, as a predicted value of the own position, each predicted value of the latitude, the longitude and the orientation corresponding to the traveling direction. It is noted that in such a case that the LIDAR unit 100 has a sensor for detecting the orientation such as a geomagnetic sensor, the landmark position prediction unit 2 may calculate the predicted values of only the latitude and the longitude. Next, the landmark position prediction unit 2 lets the landmark map acquisition unit 3 acquire information (referred to as "landmark information IL") on a landmark situated within a maximum ranging distance from the calculated predicted value of the own position. The landmark information IL includes position information per landmark and information (reflectance information) on reflectance to the laser beam per landmark. Then, on the basis of the position information included in the landmark information IL which the landmark map acquisition unit 3 acquires, the landmark position prediction unit 2 determines an angular range ("predicted angular range Rtag") of the scanning angle of the light transmission/receiving unit 1 in which the landmark is predicted to be situated. The landmark position prediction unit 2 is an example of the "determination unit" according to the present invention, and the position information included in the landmark information IL to which the landmark position prediction unit 2 refers is an example of the "first information" according to the present invention. The predicted angular range Rtag is an example of the "first direction" according to the present invention.

The landmark map acquisition unit 3 acquires the landmark information IL on the landmark which exists within the range specified by the landmark position prediction unit 2. In this case, the landmark map acquisition unit 3 may extract the landmark information IL from map information which is stored on a storage unit (unshown) or may acquire the landmark information IL through communications with a server device (unshown) which has the map information. For example, the landmark position prediction unit 2 and the landmark map acquisition unit 3 function as the "first acquisition unit" according to the present invention.

The signal processing unit 4 detects each peak position of the waveform of the segment signal Sseg sent from the light transmission/receiving unit 1 with respect to each segment and calculates, on the basis on the peak position, the distance to an object irradiated with the laser beams. Then, the signal processing unit 4 supplies the landmark position measurement unit 5 with information (referred to as "measurement data Dm") on measurement points each of which is a combination of the distance calculated per segment and the scanning angle corresponding to each segment.

At the time of receiving the measurement data Dm from the signal processing unit 4, the landmark position measurement unit 5 extracts measurement points corresponding to the landmark from all measurement points indicated by the measurement data Dm, wherein the above landmark is used as a criterion by the landmark position prediction unit 2 to determine the predicted angular range Rtag. Then, the landmark position measurement unit 5 calculates the absolute position of the target landmark based on the extracted measurement points and the predicted value of the own position calculated by the landmark position prediction unit 2. Thereafter, the landmark position measurement unit 5 supplies the own position estimation unit 6 with the calculated position (referred to as "landmark measurement position $P_{LM}$") of the landmark.

The own position estimation unit 6 calculates an estimated value (referred to as "estimated own position Pe") of the own position at the present time t based on the landmark measurement position $P_{LM}$ supplied from the landmark position measurement unit 5 and the position of the landmark on the map indicated by the landmark information IL. In this case, the own position estimation unit 6 calculates the estimated own position Pe by correcting the predicted value of the own position calculated by the landmark position prediction unit 2 based on the difference between the landmark measurement position $P_{LM}$ and the position on the map indicated by the landmark information IL. Thereby, the own position estimation unit 6 calculates the estimated own position Pe that is more accurate than the predicted value of the own position which the landmark position prediction unit 2 calculates for the purpose of determining the predicted angular range Rtag. For example, the own position estimation unit 6 calculates, as the estimated own position Pe, each estimated value of the latitude, the longitude and the orientation corresponding to the traveling direction, and in such a case that the LIDAR unit 100 has a sensor for detecting the orientation such as a geomagnetic sensor, the own position estimation unit 6 calculates the estimated values of only the latitude and the longitude. The own position estimation unit 6 supplies the landmark position prediction unit 2 with the calculated estimated own position Pe while supplying the estimated own position Pe to an external unit (e.g., a unit configured to control autonomous driving).

[Configuration of Light Transmission/Receiving Unit]

Figure 2:
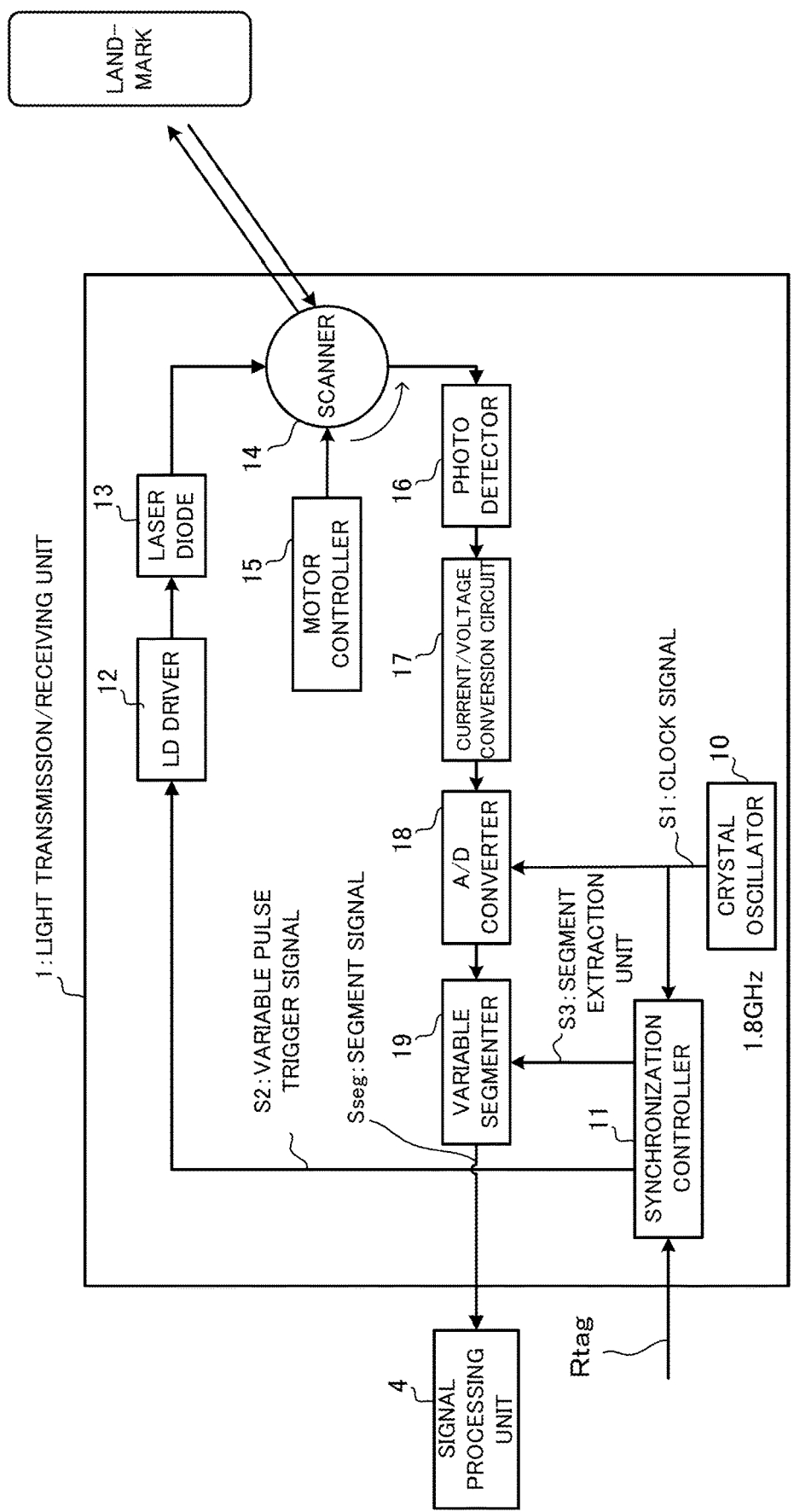
FIG. 2 illustrates a block diagram of a light transmission/receiving unit.

FIG. 2 illustrates an example of a schematic configuration of the light transmission/receiving unit 1. As illustrated in FIG. 2, the light transmission/receiving unit 1 mainly includes a crystal oscillator 10, a synchronization controller 11, a LD driver 12, a laser diode 13, a scanner 14, a motor controller 15, a photo detector 16, a current/voltage conversion circuit (Transimpedance Amplifier) 17, an A/D converter 18 and a valuable segmenter 19.

The crystal oscillator 10 supplies the synchronization controller 11 and the A/D converter 18 with a pulsed clock signal "S1". As an example, the clock frequency according to the embodiment is set to 1.8 GHz. Hereinafter, each clock based on the clock signal S1 is also referred to as "sample clock".

The synchronization controller 11 supplies the LD driver 12 with a pulsed trigger signal (referred to as "valuable pulse trigger signal S2"). On the basis of the predicted angular range Rtag supplied from the landmark position prediction unit 2, the synchronization controller 11 determines the cycle of asserting the valuable pulse trigger signal S2. According to the embodiment, the synchronization controller 11 periodically asserts the valuable pulse trigger signal S2 at intervals of either 131072 ($=2^{17}$) sample clock or 26214 sample clock. In this case, if the clock frequency is expressed by "fsmp" (=1.8 GHz), the pulse rate "fseg" of the valuable pulse trigger signal S2 is equal to "fsmp/131072" or "fsmp/26214." Hereinafter, a time period from timing of asserting the valuable pulse trigger signal S2 to the next timing of asserting the valuable pulse trigger signal S2 is referred to as "segment period". As mentioned later, the synchronization controller 11 generates the valuable pulse trigger signal S2 so that the segment period of segments corresponding to the scanning angle within the predicted angular range Rtag is shorter than the segment period of the other segments.

Figure 3:
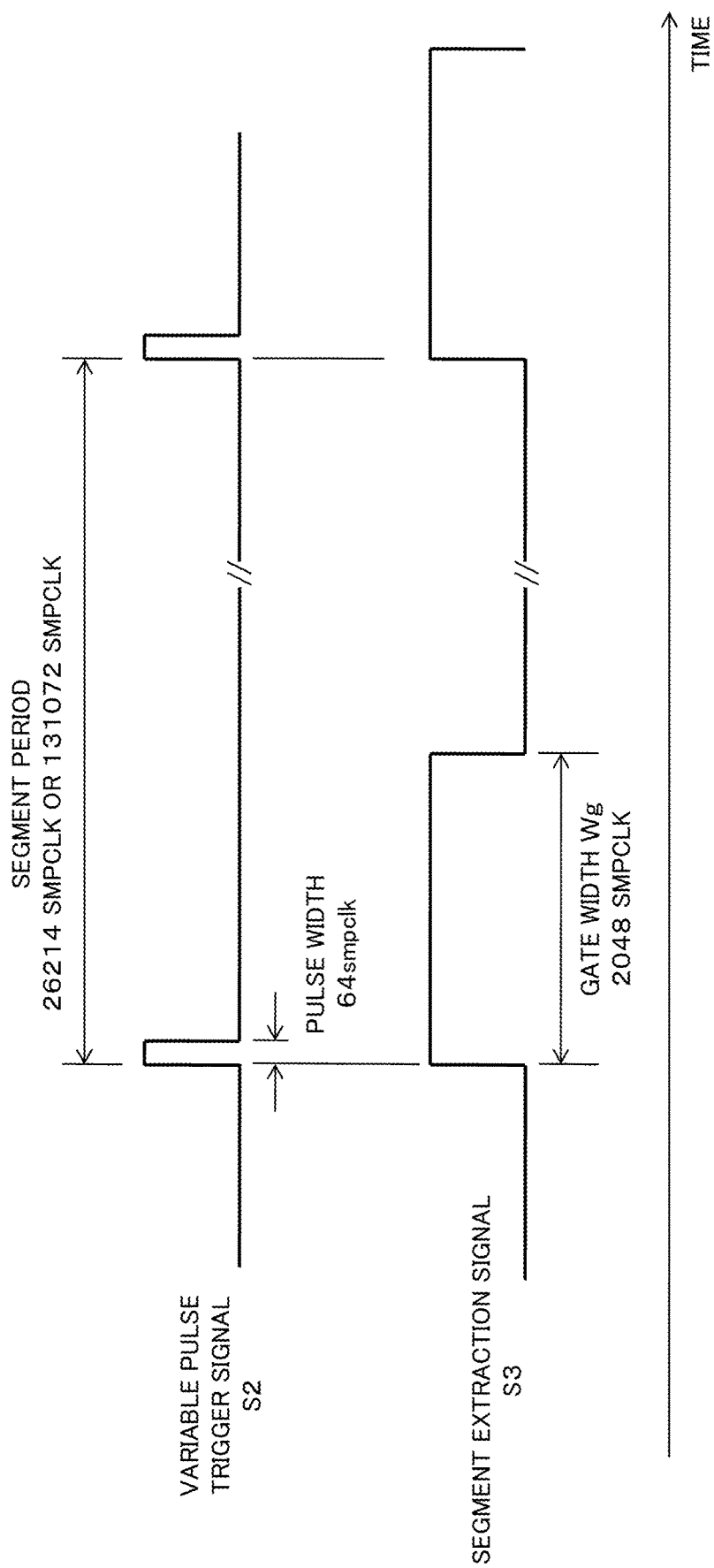
FIG. 3 illustrates waveforms of a variable pulse trigger signal and a segment extraction signal.

Additionally, the synchronization controller 11 supplies the valuable segmenter 19 with a signal (hereinafter referred to as "segment extraction signal S3") which determines the timing for the later-mentioned valuable segmenter 19 to extract the output of the A/D converter 18. Each of the valuable pulse trigger signal S2 and the segment extraction signal S3 is a logic signal and they are synchronized with each other as illustrated in FIG. 3 to be mentioned later. According to the embodiment, the synchronization controller 11 asserts the segment extraction signal S3 for a time width (referred to as "gate width Wg") equivalent to 2048 sample clocks. The synchronization controller 11 is an example of the "control unit" according to the present invention. For example, the synchronization controller 11 and the landmark position prediction unit 2 also function as a computer which executes the program according to the present invention.

The LD driver 12 supplies pulsed current to the laser diode 13 in synchronization with the valuable pulse trigger signal S2 inputted from the synchronization controller 11. For example, the laser diode 13 is an infrared pulse laser with the wavelength of 905 nm and emits pulses of light based on the pulsed current supplied from the LD driver 12. The laser diode 13 according to the embodiment emits each pulse of light for approximately five nano seconds.

The scanner 14 includes configurations of a transmission optical system and a receiving optical system. While scanning 360 degrees in the horizontal plane with pulses of light emitted from the laser diode 13, the scanner 14 leads, to the photo detector 16, the return light reflected at an object that is irradiated with the pulses of emitted light. According to the embodiment, the scanner 14 includes a motor for revolving, and the motor is controlled by the motor controller 15 to revolve once every 900 to 4500 segments. The angular resolution capability in the case of revolving once every 900 segments is 0.4° (=360°/900) per segment whereas the angular resolution capability in the case of revolving once every 4500 segments is 0.08° (=360°/4500) per segment.

Preferably, the scan surface scanned by the scanner 14 is not an umbrella surface but a flat surface. Additionally, when the LIDAR unit 100 is mounted on a moving body, it is desirable for the scan surface to be in parallel (i.e., horizontal) with the land surface on which the moving body travels. For example, the LD driver 12, the laser diode 13 and the scanner 14 function as the "emitting unit" according to the present invention.

Examples of the photo detector 16 include an avalanche photodiode, and the photo detector 16 generates a slight current in accordance with the amount of the reflective light led by the scanner 14. The photo detector 16 supplies the generated slight current to the current/voltage conversion circuit 17. The current/voltage conversion circuit 17 amplifies and converts the slight current supplied from the photo detector 16 into a voltage signal, and inputs the converted voltage signal to the A/D converter 18.

The A/D converter 18 converts, on the basis of the clock signal S1 supplied from the crystal oscillator 10, the voltage signal supplied by the current/voltage conversion circuit 17 to the digital signal, and thereafter the A/D converter 18 supplies the converted digital signal to the valuable segmenter 19. Hereinafter, a digital signal which the A/D converter 18 generates per one clock is referred to as "sample". The photo detector 16, the current/voltage conversion circuit 17 and the A/D converter 18 constitute an example of the "light receiving unit" according to the present invention.

The valuable segmenter 19 generates a segment signal Sseg by extracting digital signals which the A/D converter 18 outputs during the time period when the segment extraction signal S3 is asserted for the gate width Wg equivalent to 2048 sample clocks. The valuable segmenter 19 supplies the generated segment signal Sseg to the signal processing unit 4.

FIG. 3 illustrates a time-series waveforms corresponding to the valuable pulse trigger signal S2 and the segment extraction signal S3. As illustrated in FIG. 3, according to the embodiment, a segment period that is one cycle of the valuable pulse trigger signal S2 being asserted is determined to have the length of either 26214 sample clocks (referred to as "SMPCLK" in the drawings) or 131072 sample clocks. Furthermore, the pulse width of the valuable pulse trigger signal S2 is determined to have the length of 64 sample clocks, and the gate width Wg is determined to have the length of 2048 sample clocks.

In this case, as the segment extraction signal S3 has been asserted during a period with the length of the gate width Wg since the trigger signal S2 has been asserted, the valuable segmenter 19 extracts 2048 samples outputted by the A/D converter 18 during a period of the valuable pulse trigger signal S2 being asserted. The longer the gate width Wg is, the longer the maximum ranging distance (i.e., ranging limit distance) from the LIDAR unit 100 becomes.

According to the embodiment, the maximum ranging distance according to simple arithmetic is 170.55 m (nearly equals "{2048/1.8 GHz}·c/2", wherein "c" stands for light speed) that is a distance which the light makes a round trip for a time length corresponding to the gate width Wg. It is noted that the maximum ranging distance is slightly shorter than 170.55 m due to an origin offset being set for dealing with electrical and optical delays.

[Determination of Pulse Rate]

Next, a description will be given of the determination method of the pulse rate fseg. Schematically, the synchronization controller 11 generates the valuable pulse trigger signal S2 and the segment extraction signal S3 so that the pulse rate fseg of segments corresponding to the scanning angle within the predicted angular range Rtag is higher than the pulse rate fseg of the other segments.

Figure 4:
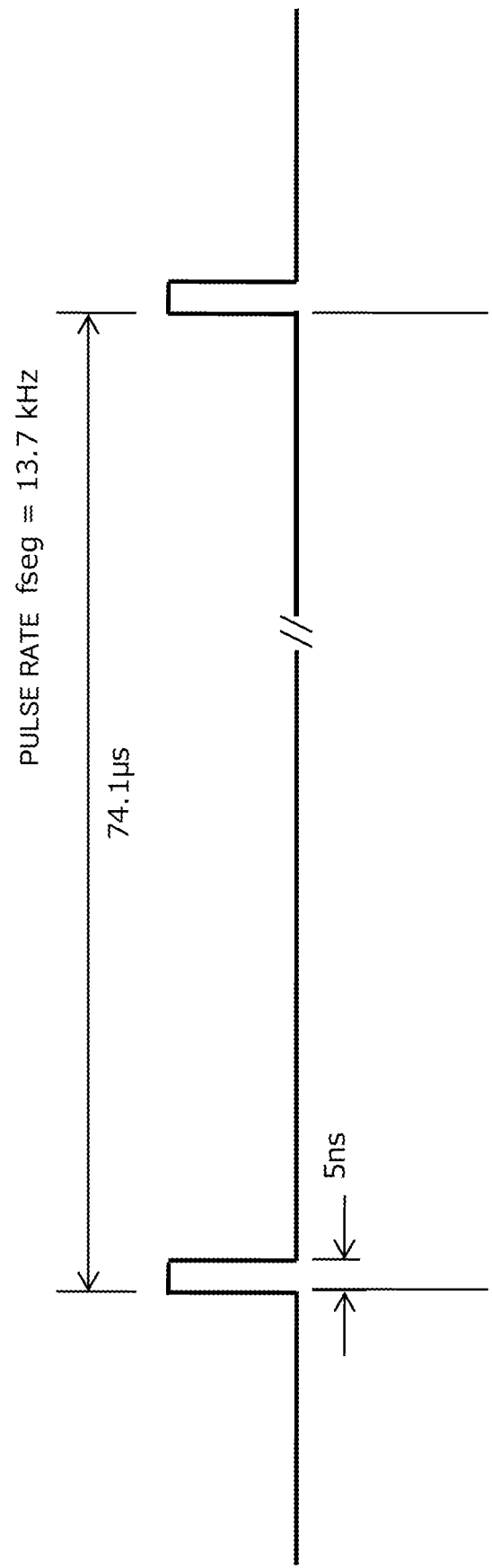
FIG. 4 illustrates the waveform of the variable pulse trigger signal of the segments corresponding to the scanning angle out of a predicted angular range.
Figure 5:
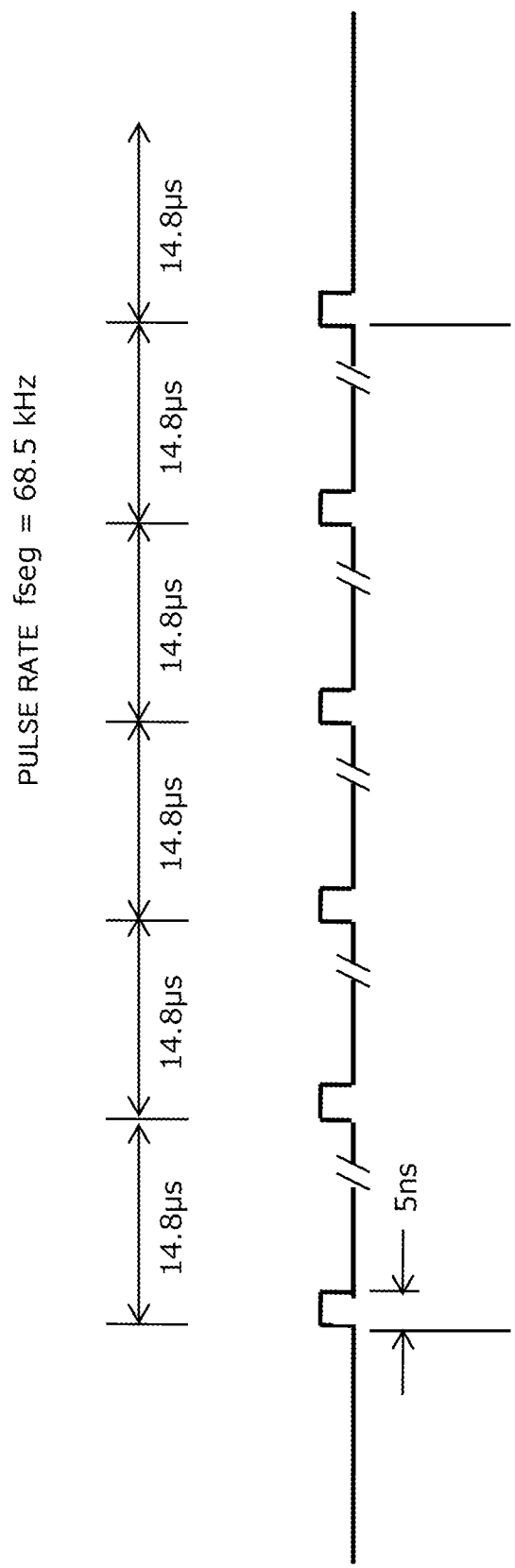
FIG. 5 illustrates the waveform of the variable pulse trigger signal of the segments corresponding to the scanning angle within the predicted angular range.

FIG. 4 illustrates the waveform of the valuable pulse trigger signal S2 of the segments corresponding to the scanning angle within the range other than the predicted angular range Rtag. FIG. 5 illustrates the waveform of the valuable pulse trigger signal S2 of the segments corresponding to the scanning angle within the predicted angular range Rtag.

According to FIG. 4 and FIG. 5, the synchronization controller 11 sets approximately 13.7 kHz as the pulse rate fseg of the segments corresponding to the scanning angle within the range other than the predicted angular range Rtag. In contrast, the synchronization controller 11 sets approximately 68.5 kHz (i.e., five times higher than 13.7 kHz) as the pulse rate fseg of the segments corresponding to the scanning angle within the predicted angular range Rtag. In this way, within the predicted angular range Rtag, the synchronization controller 11 relatively raises the pulse rate fseg to increase the scan density. Thereby, the synchronization controller 11 can acquire dense measurement points of the target landmark.

Figure 6:
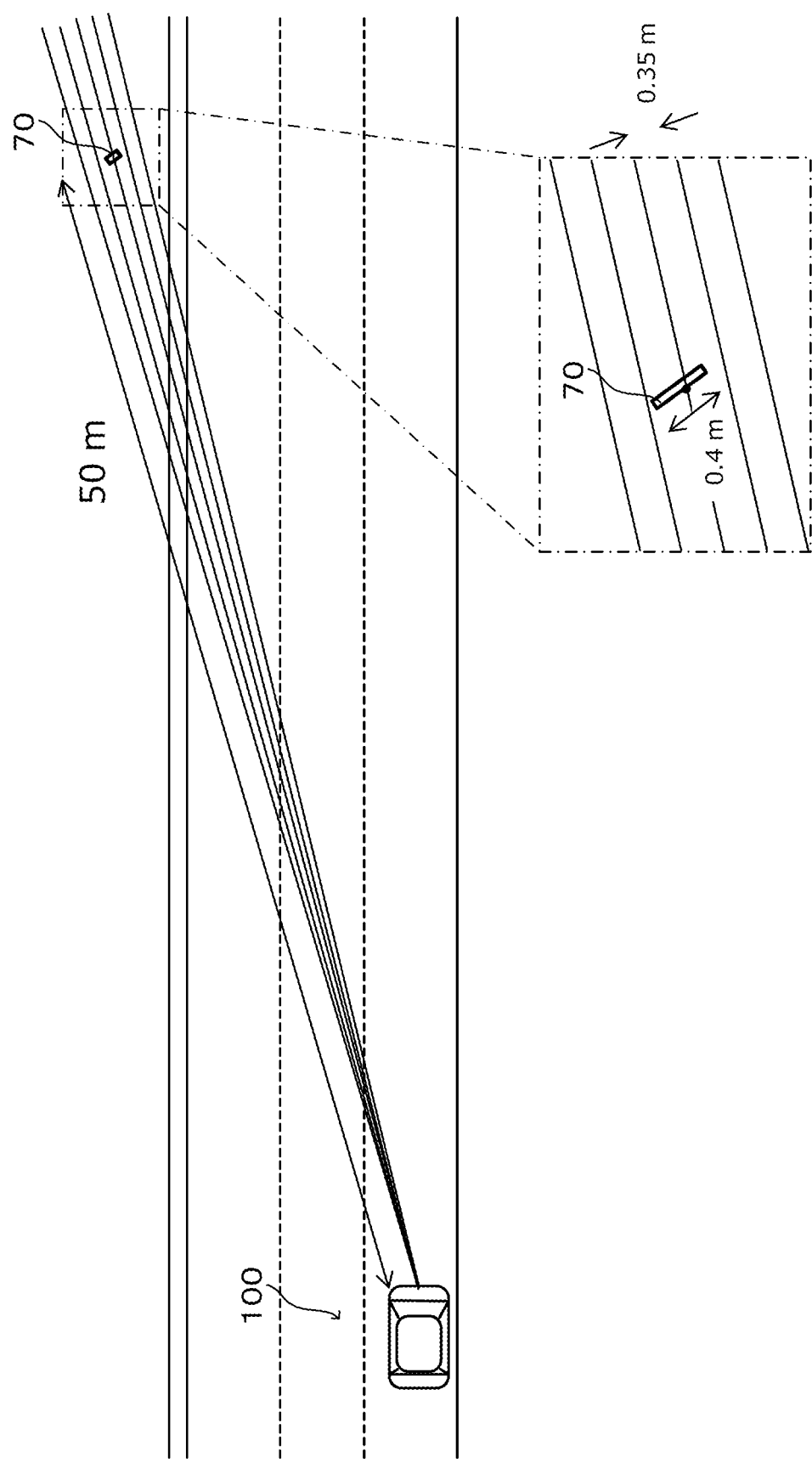
FIG. 6 illustrates paths of light pulses at the time when the light pulses are emitted at a pulse rate fixed to approximately 13.7 kHz that is equal to the pulse rate used within the range other than the predicted angular range.
Figure 7:
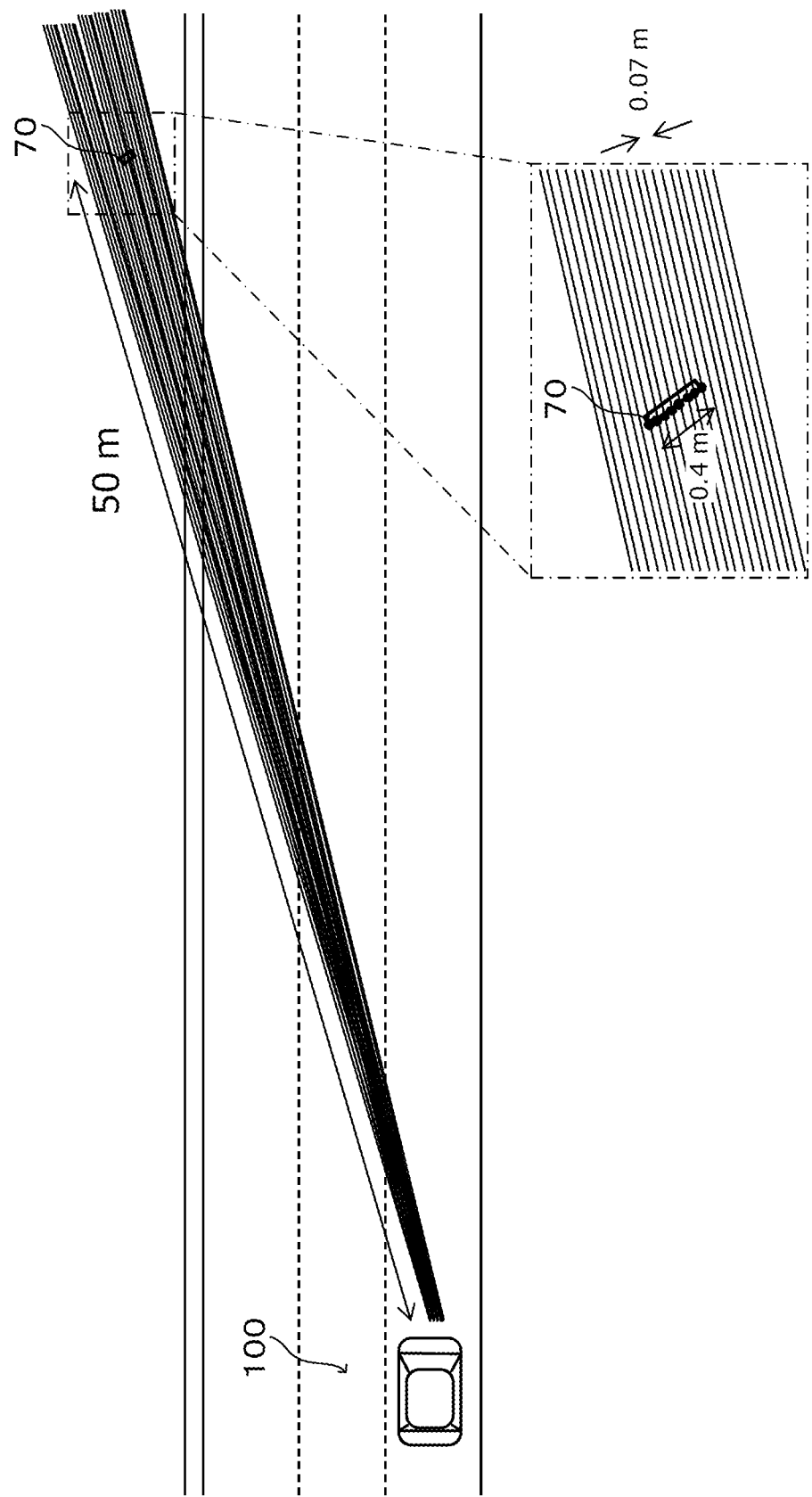
FIG. 7 illustrates paths of light pulses at the time when the pulse rate of the light pulse emission is raised to approximately 68.5 kHz.

FIG. 6 illustrates paths of light pulses within the predicted angular range Rtag in which the existence of the landmark 70 fifty meter away is estimated, wherein the light pulses are emitted at the fixed pulse rate fseg of approximately 13.7 kHz (see FIG. 4) that is equal to the pulse rate fseg used within the range other than the predicted angular range Rtag. FIG. 7 illustrates paths of light pulses within the predicted angular range Rtag in which the existence of the landmark 70 is estimated, wherein the pulse rate fseg of the light pulse emission is raised to approximately 68.5 kHz (see FIG. 5) five times higher than the pulse rate fseg in the case of FIG. 6. In both cases, the width of the landmark 70 is assumed to be 0.4 meter.

As illustrated in FIG. 6, if the pulse rate fseg is set to approximately 13.7 kHz that is the same as the pulse rate fseg within the range other than the predicted angular range Rtag, the number of the light pulse with which the landmark is irradiated is one. Thus, in this case, only one measurement point corresponding to the landmark 70 can be gained. In contrast, as illustrated in FIG. 7 if light pulses are emitted at the pulse rate fseg of the approximately 68.5 kHz (see FIG. 5), the number of the light pulses with which the landmark is irradiated is eight and therefore eight measurement points can be gained. In this case, since the landmark position measurement unit 5 recognizes the shape, the structure and the orientation of the landmark 70 and the like from the acquired eight measurement points, it is possible to precisely calculate the landmark measurement position $P_{LM}$ of the landmark 70.

Preferably, when raising the pulse rate fseg within the predicted angular range Rtag, the synchronization controller 11 controls the pulse light to have the peak power lower than usual. Generally, the criteria of eye safe that is safe even when the pulse light is incident on human eyes are determined depending on averaged power of the pulse light per unit area anywhere in the space. Furthermore, generally, the higher the frequency (rate) of the light pulse emission is, the higher the averaged power of the pulse light per unit area becomes, i.e., the lower the frequency of the light pulse emission is, the smaller the averaged power of the pulse light per unit area becomes. Above things considered, at the time of raising the pulse rate fseg, the synchronization controller 11 reduces the peak power of the pulse laser to emit. In the case of FIG. 5, compared to the case of FIG. 4, since the pulse rate fseg is higher, the level (height) of the pulse corresponding to the peak power is set to be lower. In this way, even when raising the pulse rate fseg within the predicted angular range Rtag, it is possible to achieve the eye safe by suppressing the increase of the averaged power of the pulse light per unit area anywhere in the space.

In this case, more preferably, with reference to the reflectance information included in the landmark information IL, the synchronization controller 11 controls the pulse light within the predicted angular range Rtag to have the peak power lower than usual only at the time when the reflectance of the target landmark is higher than a predetermined rate. For example, the above-mentioned predetermined rate in this case is preset through experimental trials to the lower limit of such a reflectance that the LIDAR unit 100 can generate the measurement point by using the reflective light even when controlling the peak power of the pulse light to be lower than usual. Thereby, the synchronization controller 11 can suitably suppress inability of generating the measurement point of the landmark due to the peak power of the pulse light being lower than usual.

[Process Flow]

Figure 8:
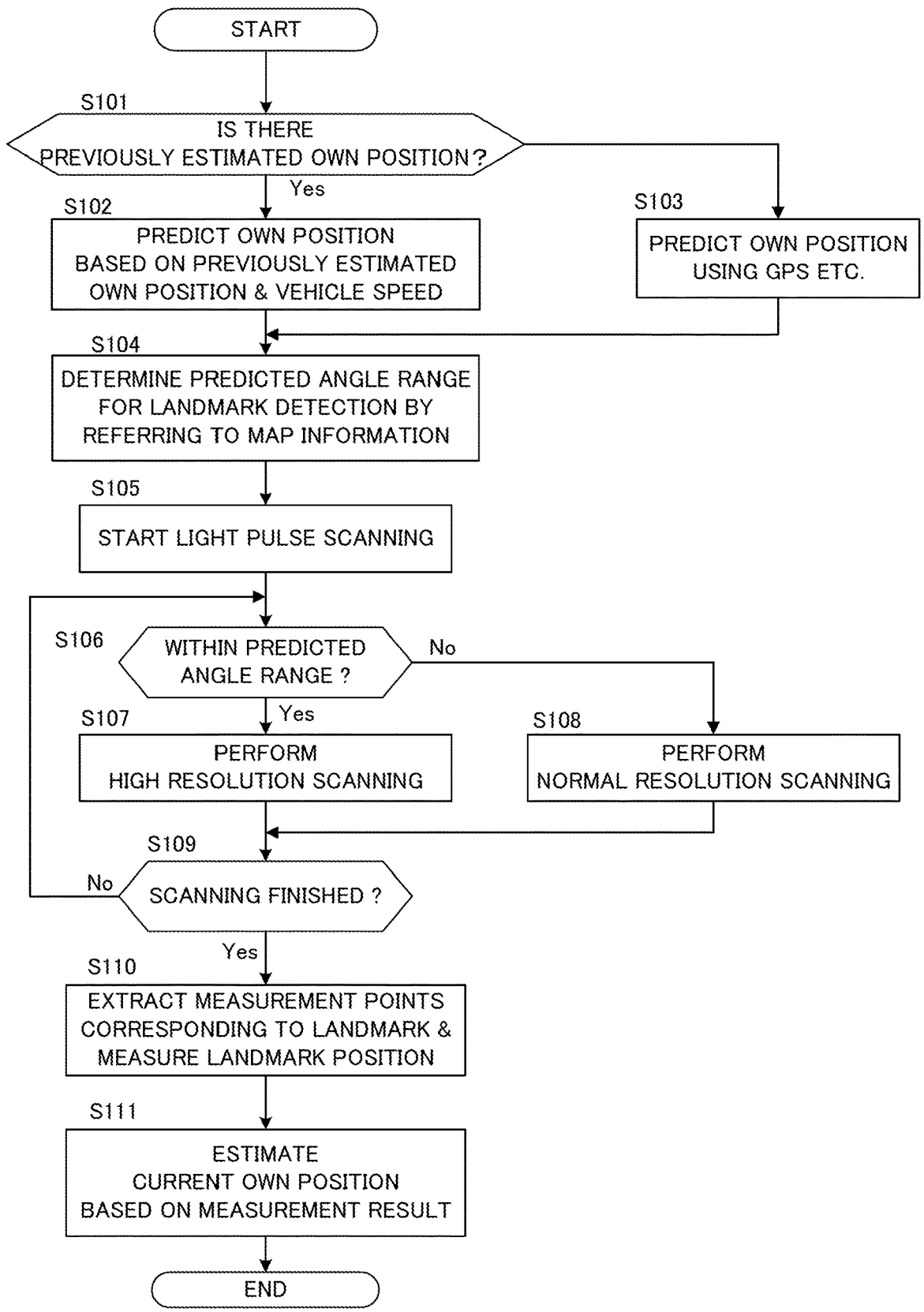
FIG. 8 illustrates a flowchart indicating the procedure of the process according to the embodiment.

FIG. 8 illustrates a flowchart indicating the procedure of the process which the LIDAR unit 100 according to the embodiment executes.

First, the landmark position prediction unit 2 determines whether or not there is an estimated own position Pe estimated at the time t−1 that corresponds to previous process frame (step S101). When there is an estimated own position Pe estimated at the time t−1 that corresponds to previous process frame (step S101; Yes), the landmark position prediction unit 2 calculates the predicted value of the own position at the time t based on the estimated own position Pe at the time t−1, the vehicle speed acquired from the vehicle speed sensor 8 and the angular velocity acquired from the gyroscope sensor 9 (step S102). In contrast, when there is no estimated own position Pe estimated at the time t−1 that corresponds to previous process frame (step S101; No), the landmark position prediction unit 2 predicts the own position at the time t based on the output of a positioning device such as a GPS receiver (step S103). The information on the present position predicted at step S102 or step S103 is an example of the "current position information" according to the present invention.

Next, on the basis of map information, the landmark position prediction unit 2 determines the predicted angular range Rtag for detecting a landmark that serves as a mark for the own positional estimation (step S104). In this case, the landmark position prediction unit 2 supplies the landmark map acquisition unit 3 with the predicted value of the own position to thereby acquire, through the landmark map acquisition unit 3, the landmark information IL which includes position information indicating a landmark position within the maximum ranging distance from the predicted value of the own position.

Then, the light transmission/receiving unit 1 starts scanning with the light pulse (step S105). In this case, the light transmission/receiving unit 1 determines whether or not the scanning angle of the segment corresponding to the light pulse to emit is within the predicted angular range Rtag (step S106). Then, when the scanning angle of the segment corresponding to the light pulse to emit is within the predicted angular range Rtag (step S106; Yes), the light transmission/receiving unit 1 performs a high resolution scanning with the light pulse (step S107). Namely, in this case, as explained with FIG. 5 and FIG. 7, the light transmission/receiving unit 1 raises the pulse rate fseg so that the pulse rate fseg is higher than usual to increase the scan density. Preferably, at the time when the reflectance indicated by the landmark information IL is equal to or higher than a predetermined rate, the light transmission/receiving unit 1 controls the pulse light to reduce the peak power. In this case, the reflectance information is an example of the "second information" according to the present invention, and the landmark position prediction unit 2 and the landmark map acquisition unit 3 constitute an example of the "second acquisition unit" according to the present invention.

In contrast, when the scanning angle of the segment corresponding to the light pulse to emit is out of the predicted angular range Rtag (step S106; No), the light transmission/receiving unit 1 performs a normal resolution scanning with the light pulse (step S108). Namely, in this case, as explained with FIG. 4 and FIG. 6, the light transmission/receiving unit 1 emits the light pulse at the normal pulse rate fseg. It is noted that the control of the light pulse emission at step S107 is an example of the "first emission mode" according to the present invention and the control of the light pulse emission at step S108 is an example of the "second emission mode" according to the present invention.

Then, the light transmission/receiving unit 1 determines whether or not the light transmission/receiving unit 1 has finished scanning all target orientation with the light pulse (step S109). When the light transmission/receiving unit 1 has not finished scanning all target orientation with the light pulse yet (step S109; No), the light transmission/receiving unit 1 executes the process at step S106 again.

In contrast, when the light transmission/receiving unit 1 has finished scanning all target orientation with the light pulse (step S109; Yes), the landmark position measurement unit 5 extracts measurement points corresponding to the landmark from the measurement points outputted by the signal processing unit 4 and calculates the landmark measurement position $P_{LM}$ based on the extracted measurement points (step S110). In this case, for example, the landmark position measurement unit 5 extracts measurement points corresponding to the scanning angle within the predicted angular range Rtag and calculates the landmark measurement position $P_{LM}$ by specifying the shape, structure and orientation of the landmark from the extracted measurement points. For example, the landmark position measurement unit 5 calculates the longitude and the latitude of the landmark based on a pair of the distance and the scanning angle which represents the extracted measurement points and on the own position predicted at step S102 or S103. Then, the landmark position measurement unit 5 determines the calculated longitude and the latitude as the landmark measurement position $P_{LM}$.

Then, the own position estimation unit 6 calculates the estimated own position Pe based on the landmark measurement position $P_{LM}$ calculated by the landmark position measurement unit 5 (step S111). In this case, for example, with reference to a predetermined map or equation, the own position estimation unit 6 calculates the estimated own position Pe by correcting, on the basis of the difference between landmark measurement position $P_{LM}$ and the position indicated by the landmark information IL which the landmark map acquisition unit 3 acquires, the predicted value of the own position predicted at step S102 or S103.

As explained above, a LIDAR unit 100 according to the embodiment includes: an LD driver 12, a laser diode 13, and a scanner 14 that correspond to an emission unit; a photo detector 16, a current/voltage conversion circuit 17, a A/D converter 18 and an valuable segmenter 19 that correspond to a light receiving unit; a landmark position prediction unit 2 and a landmark map acquisition unit 3 that acquire position information indicating the position of a landmark on a map; and a synchronization controller 11 that generates a valuable pulse trigger signal S2 and a segment extraction signal S3. On the basis of a predicted value of the current position of a vehicle and the position of the landmark on the map, the landmark position prediction unit 2 determines a predicted angular range Rtag in which the landmark is predicted to be situated. The synchronization controller 11 generates the valuable pulse trigger signal S2 and the segment extraction signal S3 such that the scan density of the light pulse is higher in the predicted angular range Rtag than the scan density of the light pulse in the other range. Thereby, the LIDAR unit 100 can precisely detect a landmark needed to estimate the own position and therefore can precisely estimate the own position.

MODIFICATIONS

Next, a description will be given of preferred modifications of the embodiment. The following modifications may be applied to the above embodiment in any combination.

First Modification

At step S108 in FIG. 8, the synchronization controller 11 may generate the valuable pulse trigger signal S2 so as not to emit the light pulse at segments corresponding to the scan angle within the range other than the predicted angular range Rtag. In this case, at segments corresponding to the scanning angle within the predicted angular range Rtag, the synchronization controller 11 asserts the valuable pulse trigger signal S2 in the same way as the process at step S107 in FIG. 8 so that the pulse rate fseg is high enough to acquire the measurement points of the landmark. In contrast, the synchronization controller 11 does not assert the valuable pulse trigger signal S2 at the segments corresponding to the scanning angle within the range other than the predicted angular range Rtag. Thus, the LIDAR unit 100 does not perform the light pulse scanning within the range other than the predicted angular range Rtag.

According to this mode, the LIDAR unit 100 can prevent generating unnecessary measurement points corresponding to the scanning direction in which there is no target landmark of detection and suitably reduce the processing load.

Second Modification

Instead of raising the pulse rate fseg within the predicted angular range Rtag, the light transmission/receiving unit 1 may slow down the speed of the light pulse scanning within the predicted angular range Rtag.

In this case, the synchronization controller 11 generates a fixed pulse trigger signal configured to fix the pulse rate fseg regardless of whether or not it is within the predicted angular range Rtag and supplies the signal to the LD driver 12. The motor controller 15 receives information on the predicted angular range Rtag from the landmark position prediction unit 2 and determines the scanning speed of the scanner 14 so that the scanning speed at the time when the scanning angle is within the predicted angular range Rtag is slower than the scanning speed at the time when the scanning angle is out of the predicted angular range Rtag. In this case, the motor controller 15 is an example of the "control unit" according to the present invention. Even in this case, the light transmission/receiving unit 1 can suitably increase the scan density within the predicted angular range Rtag in which the landmark is predicted to exist and acquire dense measurement points of the landmark that serves as a mark for the own position estimation.

Third Modification

The synchronization controller 11 may divide the setting value of the pulse rate fseg used within the predicted angular range Rtag into multiple stages. For example, the synchronization controller 11 divides the predicted angular range Rtag into a range which is within a predetermined angle from the center angle of the predicted angular range Rtag and the other range. Then, the synchronization controller 11 determines the pulse rate fseg so that the pulse rate fseg within the former range of the predicted angular range Rtag is higher than the pulse rate fseg within the latter range of the predicted angular range Rtag. In this way, by dividing the setting value of the pulse rate fseg used within the predicted angular range Rtag into multiple stages, it is possible to increase the scan density within the predicted angular range Rtag in which the existing probability of the landmark is high. Thus, it is possible to efficiently and precisely acquire the measurement points of the landmark.

Fourth Modification

The LIDAR unit 100 may determine the estimated own position Pe by calculating each landmark measurement position $P_{LM}$ corresponding to multiple landmarks.

In this case, for example, the light transmission/receiving unit 1 determines each predicted angular range Rtag corresponding to each landmark. Then, the landmark position measurement unit 5 extracts each set of measurement points corresponding to each landmark from measurement points within each predicted angular range Rtag. Thereby, the landmark position measurement unit 5 calculates each landmark measurement position $P_{LM}$ corresponding to each landmark. The own position estimation unit 6 calculates a difference with respect to each landmark between the landmark measurement position $P_{LM}$ and the position on the map. Then, on the basis of these differences, the own position estimation unit 6 determines the correction amount of the predicted value of the own position by applying a known interpolation method.

Fifth Modification

The LIDAR unit 100 may be a LIDAR (i.e., multi-layer LIDAR) which repeatedly performs a horizontal scanning by the scanner 14 with respect to multiple layers arranged in the vertical direction. In this case, for example, the LIDAR unit 100 calculates the estimated own position Pe by executing the processing according to the embodiment any one of the multiple layers. It is noted that the landmark position measurement unit 5 may extract measurement points of the landmark within the predicted angular range Rtag per layer and that use them for matching the shape of the landmark per height.

Sixth Modification

The configuration of the light transmission/receiving unit 1 illustrated in FIG. 2 is an example and the configuration to which the present invention can be applied is not limited to the configuration illustrated in FIG. 2. For example, the laser diode 13 and the motor controller 15 may be configured to revolve together with the scanner 14.

Seventh Modification

In such a case that the LIDAR unit 100 executes recognition processing of the surrounding environment in addition to the own position estimation processing explained in the embodiment, the LIDAR unit 100 switches two modes per process frame between one mode to change the pulse rate fseg in accordance with the predicted angular range Rtag and the other mode to fix the pulse rate fseg regardless of whether or not it is within the predicted angular range Rtag. Thereby, it is possible to prevent deterioration of the detectability of an object with a low reflectance at the time of raising the pulse rate fseg and reducing the peak power of the light pulse.

BRIEF DESCRIPTION OF REFERENCE NUMBERS

1 Light transmission/receiving unit
2 Landmark position prediction unit
3 Landmark map acquisition unit
4 Signal processing unit
5 Landmark position measurement unit
6 Own position estimation unit
8 Vehicle speed sensor
9 Gyroscope sensor
100 LIDAR unit

The invention claimed is:

1. A light control device mounted on a moving body comprising:
   a transmission/receiving unit configured to include an emitting unit and a receiving unit, the emitting unit emitting light while changing an outgoing direction of the light, the receiving unit receiving the light;
   a computer configured to execute a program stored in a memory to function as:
      a first acquisition unit configured to acquire first information indicating at least a position of a predetermined object;
      a second acquisition unit configured to acquire second information which indicates a light reflectance of the predetermined object and which is registered in map information; and
      a control unit configured to perform a control of the emitting unit,
      wherein the control unit performs, at a time when the light reflectance of the predetermined object indicated by the second information is equal to or higher than a predetermined rate, the control of the emitting unit so that an intensity of the light emitted in a first direction in which the predetermined object exists is lower than an intensity of the light emitted in the other direction, the first direction being estimated on a basis of current position information of the moving body and the first information.

2. The light control device according to claim 1,
   wherein the control unit performs the control of the emitting unit so that a first frequency of emitting the light in the first direction is higher than a second frequency of emitting the light in the other direction.

3. The light control device according to claim 2,
   wherein the control unit performs the control so that a scanning speed in the first direction by the emitting unit is slower than a scanning speed in the other direction by the emitting unit.

4. A control method executed by a light control device mounted on a moving body, the light control device controlling a transmission/receiving unit, the transmission/receiving unit including an emitting unit and a receiving unit, the emitting unit emitting light while changing an outgoing direction of the light, the receiving unit receiving the light, the control method comprising:
   a first acquisition unit configured to acquire first information indicating at least a position of a predetermined object;
      a second acquisition unit configured to acquire second information which indicates a light reflectance of the predetermined object and which is registered in map information; and
   a control unit configured to perform a control of the emitting unit,
   wherein the control unit performs, at a time when the light reflectance of the predetermined object indicated by the second information is equal to or higher than a predetermined rate, the control of the emitting unit so that an intensity of the light emitted in a first direction in which the predetermined object exists is lower than an intensity of the light emitted in the other direction, the first direction being estimated on a basis of current position information of the moving body and the first information.

* * * * *